United States Patent
Tso et al.

(10) Patent No.: US 7,589,005 B2
(45) Date of Patent: Sep. 15, 2009

(54) METHODS OF FORMING SEMICONDUCTOR STRUCTURES AND SYSTEMS FOR FORMING SEMICONDUCTOR STRUCTURES

(75) Inventors: Chia-Tsung Tso, Hsinchu (TW); Hann-Ru Chen, Keelung (TW); Yu-Hsiang Fa, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 189 days.

(21) Appl. No.: 11/537,157

(22) Filed: Sep. 29, 2006

(65) Prior Publication Data

US 2008/0081441 A1 Apr. 3, 2008

(51) Int. Cl.
*H01L 21/3205* (2006.01)

(52) U.S. Cl. ........................ 438/585; 438/275; 438/669; 438/714; 438/733; 438/734

(58) Field of Classification Search ................. 438/275, 438/585, 669, 714, 733, 734
See application file for complete search history.

(56) References Cited

U.S. PATENT DOCUMENTS

| 5,843,835 | A  | * | 12/1998 | Liu ............................. 438/585 |
| 5,994,234 | A  | * | 11/1999 | Ouchi ......................... 438/719 |
| 6,232,209 | B1 | * | 5/2001  | Fujiwara et al. ............. 438/585 |
| 6,376,388 | B1 | * | 4/2002  | Hashimoto et al. .......... 438/728 |
| 6,605,521 | B2 | * | 8/2003  | Ajmera et al. ............... 438/595 |
| 7,259,067 | B2 | * | 8/2007  | Yang .......................... 438/264 |
| 2005/0048787 | A1 | * | 3/2005 | Negishi et al. .............. 438/706 |
| 2006/0057805 | A1 | * | 3/2006 | Lee ............................. 438/257 |
| 2006/0154487 | A1 | * | 7/2006 | Wang et al. ................. 438/714 |
| 2007/0020777 | A1 |   | 1/2007 | Tso et al. |
| 2007/0166973 | A1 | * | 7/2007 | Rauf et al. .................. 438/592 |
| 2007/0190795 | A1 | * | 8/2007 | Zhuang et al. .............. 438/722 |

* cited by examiner

*Primary Examiner*—Kevin M Picardat
*Assistant Examiner*—Bac H Au
(74) *Attorney, Agent, or Firm*—Duane Morris LLP

(57) ABSTRACT

A method and system for forming a semiconductor structure includes forming at least one material layer over a substrate. At least one portion of the material layer is etched with at least one first precursor, thereby defining at least one material pattern. Charges attached to the material pattern are removed with at least one discharge gas.

14 Claims, 10 Drawing Sheets

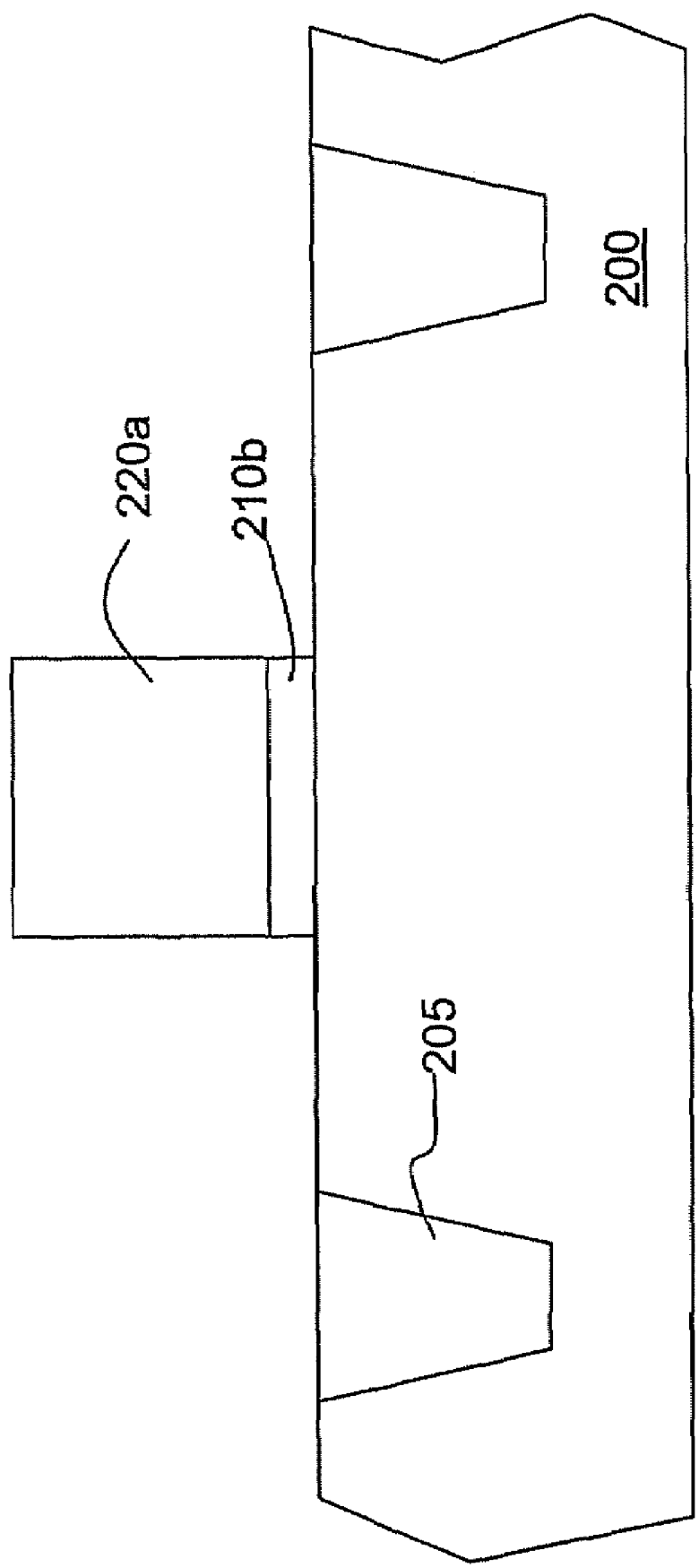

METHODS OF FORMING SEMICONDUCTOR STRUCTURES AND SYSTEMS FOR FORMING SEMICONDUCTOR STRUCTURES

BACKGROUND OF THE INVENTION

1. Field of the Invention

The present invention relates to methods for forming semiconductor structures and systems for forming semiconductor structures, and more particularly to methods for forming gate structures and systems for forming gate structures.

2. Description of the Related Art

With advances associated with electronic products, semiconductor technology has been widely applied in manufacturing memories, central processing units (CPUs), liquid crystal displays (LCDs), light emission diodes (LEDs), laser diodes and other devices or chip sets. In order to achieve high integration and speed targets, dimensions of semiconductor integrated circuits, such as width of gate structures, continue shrinking.

FIGS. 1A and 1B are schematic cross sectional views showing undercuts of a gate structure and footings of a gate structure.

Referring to FIG. 1A, shallow trench isolation structures 105 are formed within a substrate 100. A gate dielectric layer 110 and a polysilicon layer 120 are sequentially formed over the substrate 100. The stacked structure of the gate dielectric layer 110 and the polysilicon layer 120 is generally referred to as a gate structure. The gate structure can be formed by forming a dielectric layer and a layer of polysilcion material over the substrate 100. The dielectric layer and the layer of polysilicon material are then subjected to a photolithographic process and an etch process, thereby forming the gate dielectric layer 110 and the polysilicon layer 120. As shown in FIG. 1A, undercuts 115 undesirably exist at the bottom of the region of the gate structure, i.e., the bottom of the polysilicon layer 120 and the gate dielectric layer 110. Under some etch conditions, a gate structure including a gate dielectric layer 130 and a polysilicon layer 140 are formed over the substrate 100 and include footings 135 as shown in FIG. 1B. The footings 135 of the gate structure are undesirably formed at the bottom region thereof.

As described above, dimensions, e.g., width, of gate structures continue to shrink. Minor variations in the width of gate structures may significantly affect electrical characteristics of transistors formed from the gate structures. For example, the undercuts 115 shown in FIG. 1A increase resistance of the gate structure due to the small cross sectional area of the polysilicon layer 120. Further, the smaller width "w1" at the bottom of the polysilicon layer 120 may also result in short channel effects, thereby adversely affecting currents and threshold voltages of the transistor using the gate structure. The footings 135 of FIG. 1B also present problems as they reduce resistance of the gate structure due to its large cross sectional area. In addition, the large width "w2" of the polysilicon layer 130 may also undesirably affect transistor threshold voltages and operating currents. It would therefore be desirable to eliminate the aforementioned shortcomings associated with the footings and undercuts.

Based upon the foregoing, it can be seen that improved methods and systems for forming gate structures are desired.

SUMMARY OF THE INVENTION

In accordance with some exemplary embodiments, a method for forming a semiconductor structure includes forming at least one material layer over a substrate. At least one portion of the material layer is etched with at least one first precursor, thereby defining at least one material pattern. Charges attached to the material pattern are removed with at least one discharge gas.

In accordance with some exemplary embodiments, a system for forming a semiconductor structure comprises a processor, an etch apparatus and a measurement apparatus. The processor is coupled to the etch apparatus and the measurement apparatus. The etch apparatus is configured to etch at least one portion of a material layer formed over a first substrate with at least one first precursor, thereby defining at least one material pattern and to remove charges of the material pattern with at least one discharging gas. The measurement apparatus is configured to monitor a profile of the material pattern, wherein the processor is configured to compare the profile of the material pattern with a pre-defined profile, thereby yielding at least one comparison result and to apply at least one processing parameter based on the comparison result to the etch apparatus for processing a second substrate.

The above and other features of the present invention will be better understood from the following detailed description of the embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention is not limited thereto. It is emphasized that, according to common practice, the various features of the drawings are not necessarily to scale. On the contrary, the dimensions of the various features are arbitrarily expanded or reduced for clarity. Like numerals denote like features throughout the specification and drawing.

FIGS. 2A-2G are schematic cross-sectional views of an exemplary method of forming a gate structure.

DESCRIPTION OF THE PREFERRED EMBODIMENT

Figure 1A:
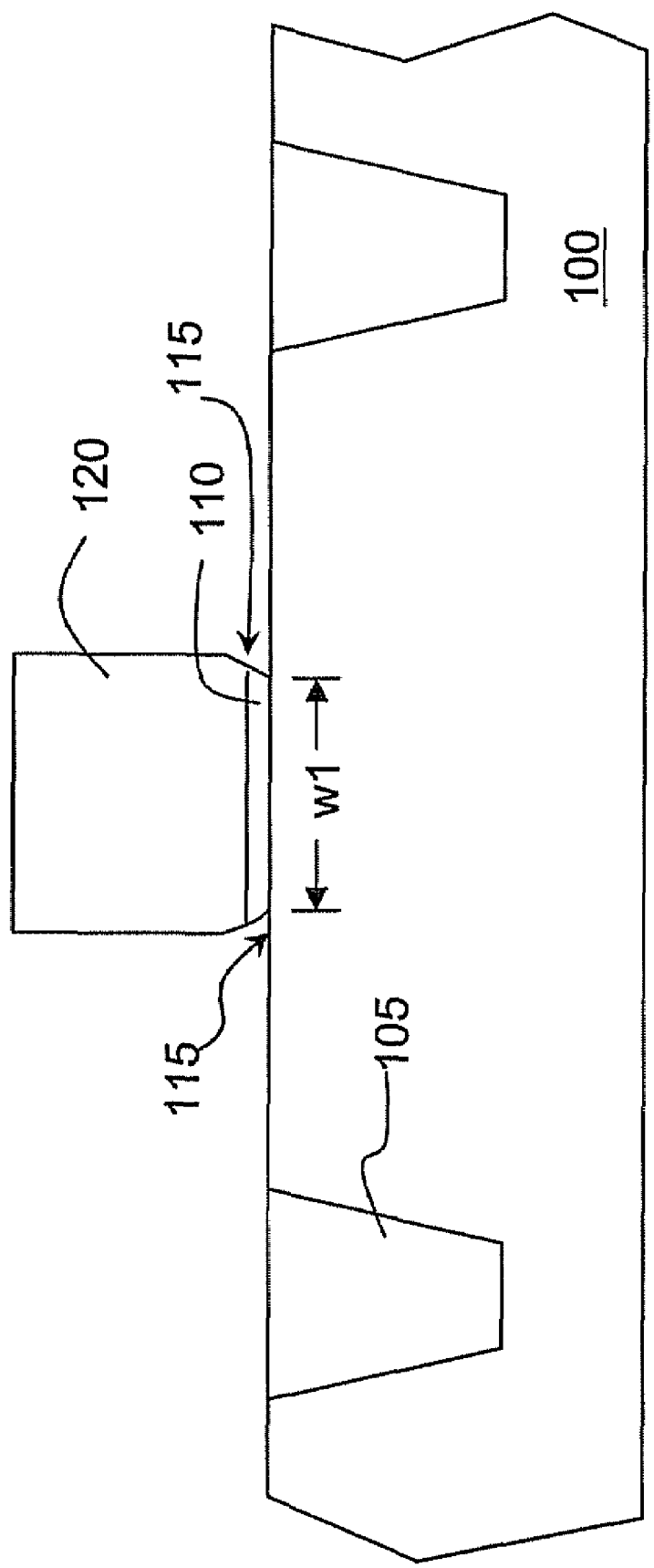
FIGS. 1A and 1B are schematic cross sectional views showing undercuts of a gate structure and footings of a gate structure.
Figure 1B:
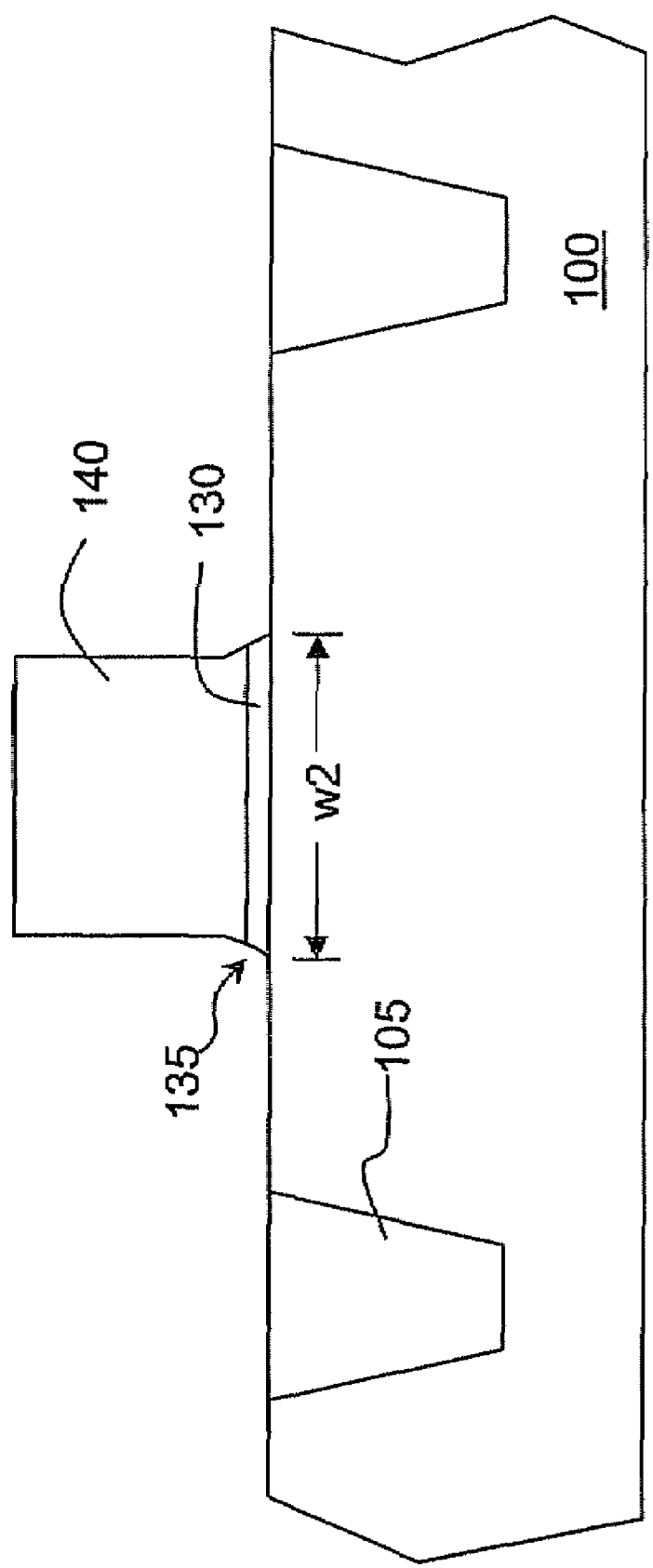

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top"and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIGS. 2A-2G are schematic cross-sectional views of an exemplary method of forming a gate structure.

Figure 2A:
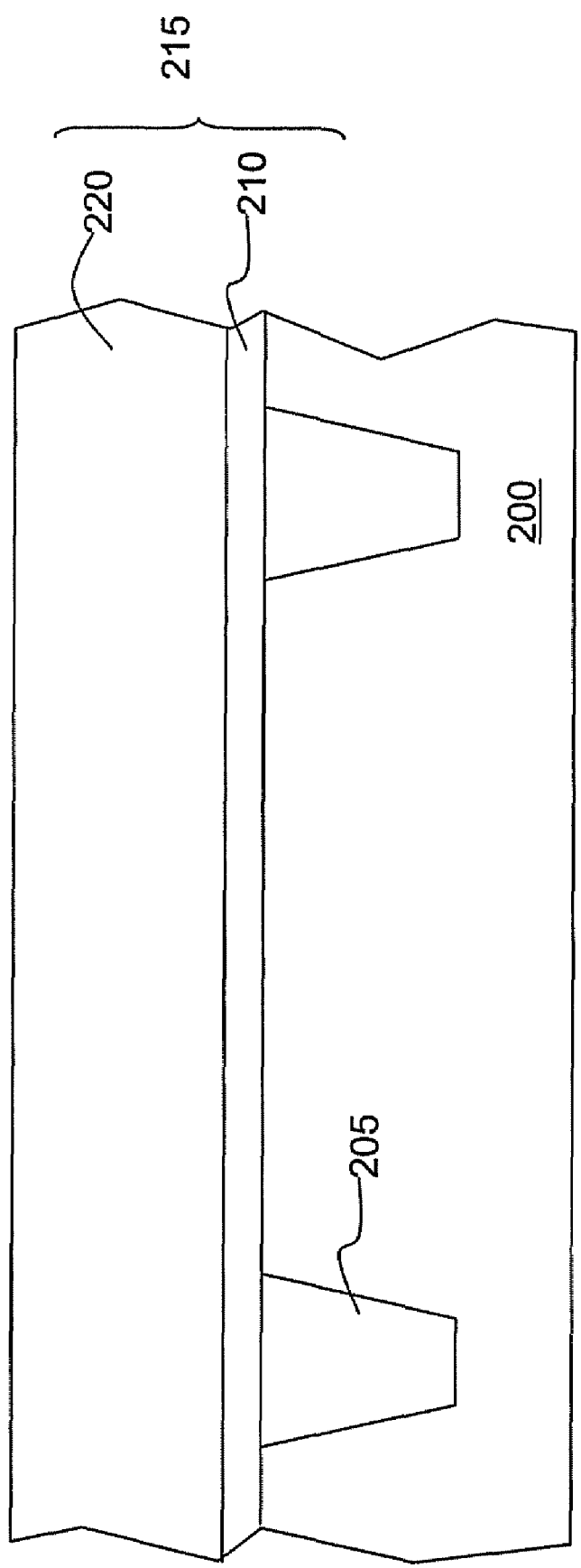

As shown in FIG. 2A, at least one isolation structure 205, e.g., shallow trench isolation structures or LOCOS (local oxidation of silicon) structure, is formed within a substrate 200. The isolation structures 205 may comprise a dielectric material, e.g., oxide, nitride, oxynitride, other isolation material or combinations thereof, and may be formed by, for example, a shallow trench isolation processing step, a LOCOS processing step or the like. The substrate 200 can be a P-type or N-type silicon substrate, a silicon-on-insulator (SOI) substrate, a III-V compound substrate, a display substrate such as a liquid crystal display (LCD), plasma display or electro luminescence (EL) lamp display, or a light emitting diode (LED) substrate, for example.

For some embodiments, at least one material layer 215 is formed over the substrate 200. In some exemplary embodiments, the material layer 215 may comprise at least one of a dielectric layer such as an oxide layer, nitride layer, oxynitride layer or the like, a conductive layer such as a silicon layer, polysilicon layer, metal-containing layer (e.g., aluminum (Al) layer, copper (Cu) layer, AlCu layer, other similar layer or combination thereof), or combinations thereof. Referring to FIG. 2A, the material layer 215 may comprise, for example, a gate dielectric layer 210 and a polysilicon layer 220. The gate dielectric layer 210, such as an oxide layer, nitride layer, oxynitride layer, other dielectric material layer, or combinations thereof, may be formed by a thermal oxidation process, a chemical vapor deposition (CVD) process or other suitable processes. For embodiments using a thermal oxidation process, oxygen ($O_2$) and/or hydrogen dioxide ($H_2O$) may be used as reactants for reacting with the substrate 200, thereby forming the gate dielectric layer 210 over the substrate 200. For other embodiments using a CVD process, a silane-based chemical (e.g., $SiH_4$ or $SiH_2Cl_2$) and $O_2$ or $N_2O$ are provided as reactants for forming the gate dielectric layer 210 over the substrate 200. The polysilicon layer 220 may be formed by, for example, a CVD processing step or other suitable methods. In some embodiments, the polysilicon layer 220 and the gate dielectric layer 210 are provided for forming a gate structure (not shown in FIG. 2A, but shown in FIG. 2G) as set forth below.

Figure 2B:
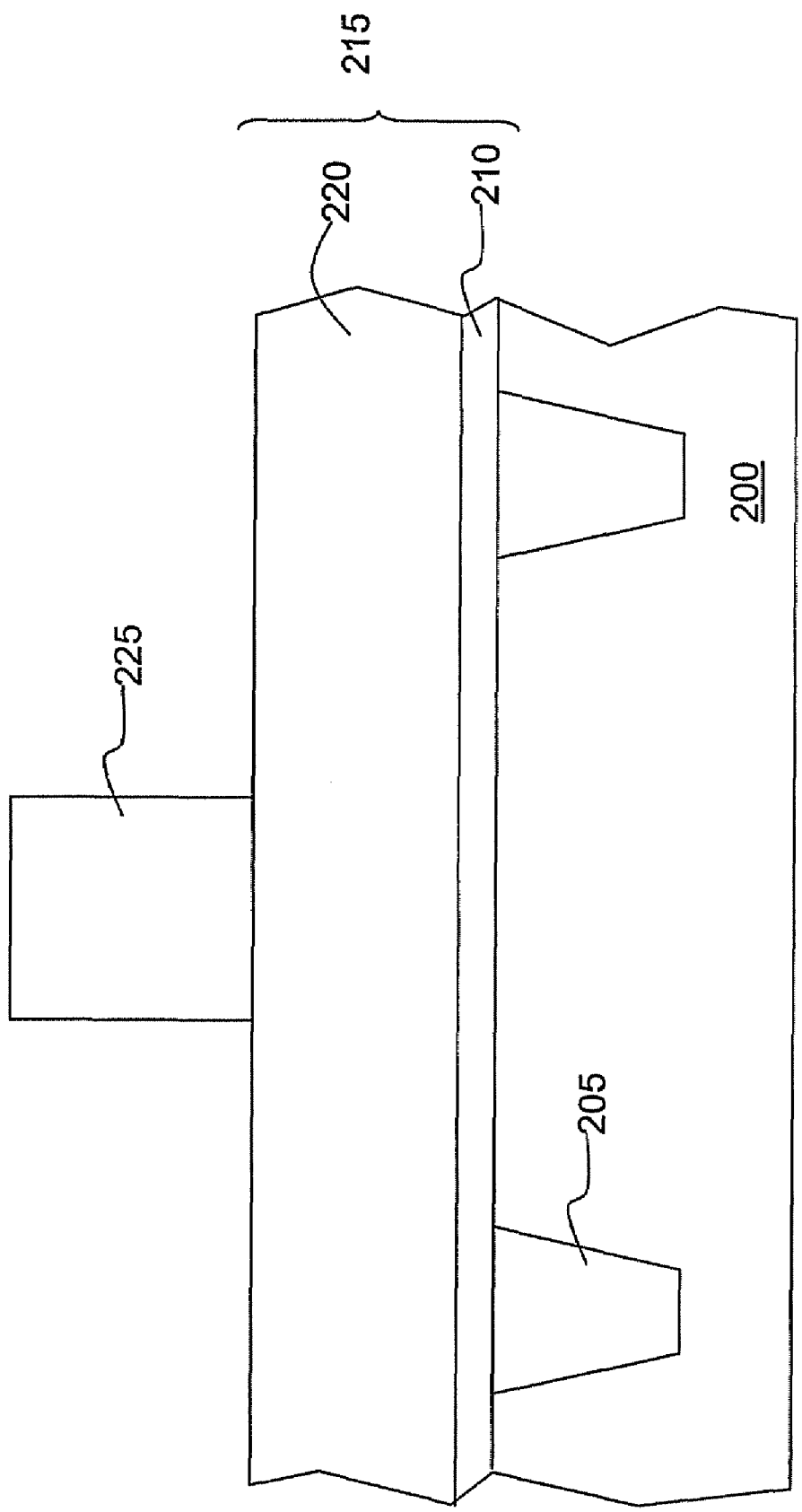

Referring to FIG. 2B, a mask layer 225 is formed over the material layer 215, e.g., the polysilicon layer 220. The mask layer 225 may comprise, for example, a photoresist mask layer, a dielectric material mask layer, e.g., an oxide layer, nitride layer, oxynitride layer, or other material layer which has an etch rate that is different than that of the material layer 215 (e.g., different than the polysilicon layer 220), or combinations thereof. According to the exemplary embodiment in which mask layer 225 is photoresist, the photoresist pattern 225 can be formed by any suitable photolithographic processing step or steps, for example.

Figure 2C:
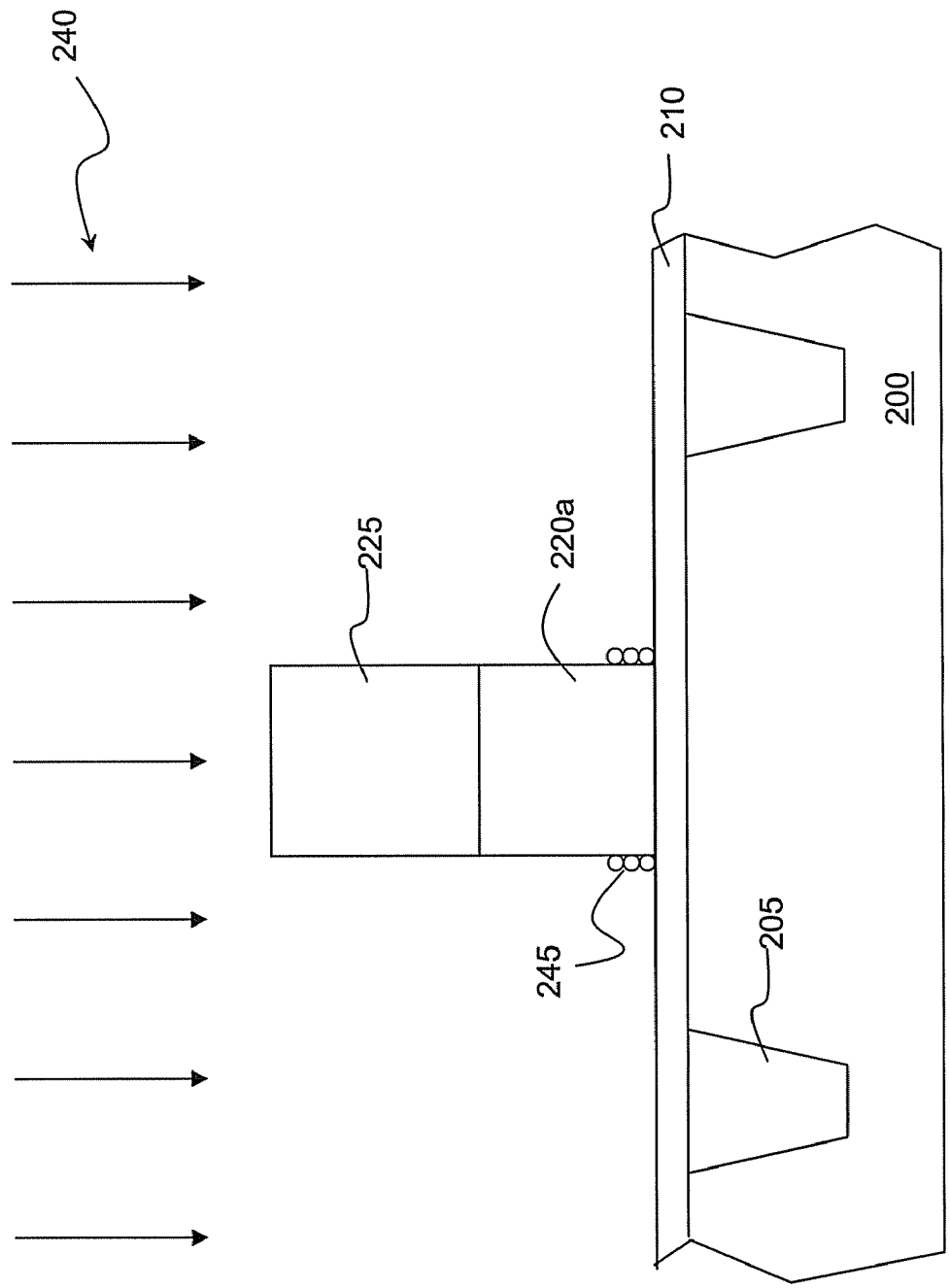

Referring to FIG. 2C, the material layer 215, e.g., the polysilicon layer 220, is partially etched with at least one precursor (not shown) by an etch step 240, thereby forming at least one material pattern, e.g., the polysilicon material pattern 220a. The precursor may comprise, for example, at least one of chlorine gas ($Cl_2$), hydrogen bromide (HBr) and carbon fluoride ($CF_4$) and at least one of helium (He), oxygen gas ($O_2$) and nitrogen ($N_2$). In some embodiments, step 240 is generally referred to as a "first main etch (ME1)" step. During step 240, at least one of $Cl_2$, HBr and $CF_4$ are ionized into $Cl-$, $Br-$ and $F-$, respectively and interact with the exposed portions of polysilicon layer 220, i.e., that parts not covered by the mask layer 225, thereby partially etching the polysilicon layer 220. At least one of He, $O_2$ and $N_2$ may be provided as carrier gases in step 240. Step 240 substantially defines the profile of the polysilicon material pattern 220a such that the width of the polysilicon material pattern 220a falls within a desired range which is correlated to technology used and the particular transistors desired to be formed. In some exemplary embodiments, the exposed portion of polysilicon layer 220 is completely etched and removed to expose gate dielectric layer 210 and in other exemplary embodiments, a portion of the polysilicon layer 220, which is not covered by the mask layer 225, remains over the gate dielectric layer 210, i.e., the exposed portions of polysilicon layer 220 are incompletely etched. The remaining polysilicon layer (not shown) may be removed by a subsequent etch step, e.g., step 250, described below. In other embodiments, step 240 may partially or completely remove portions of the gate dielectric layer 210 which are not covered by the mask layer 225.

Since $Cl-$, $Br-$ and/or $F-$ are provided in step 240 for partially removing the polysilicon layer 220, charges 245 may build up and are attached to the polysilicon material pattern 220a, e.g., its bottom region. Charges 245 can be positive or negative charges. The polarity of the charges 245 is correlated to the ions or plasmas provided for processing the material layer 215.

Figure 2D:
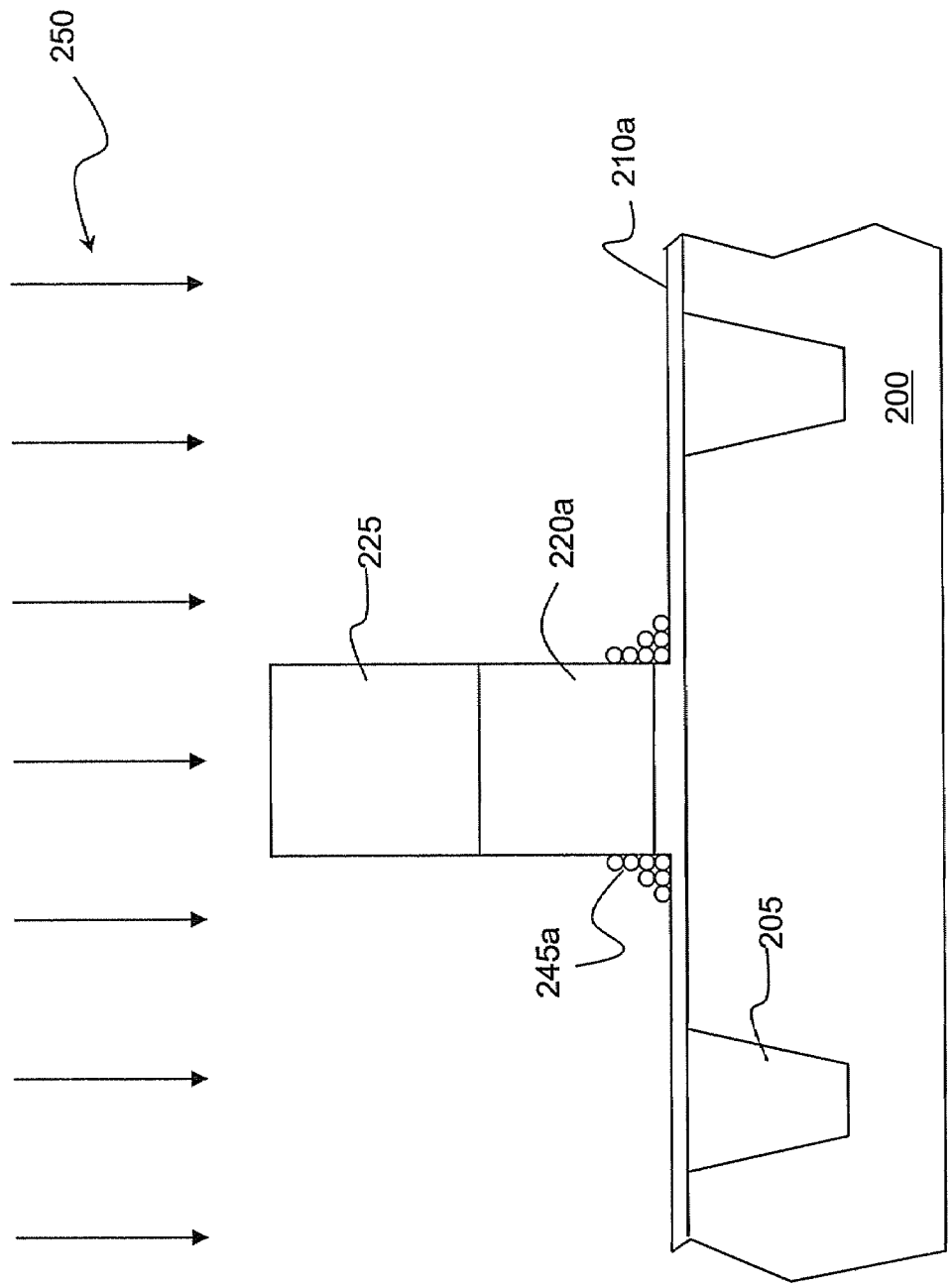

Referring to FIG. 2D, the polysilicon material pattern 220a and/or the gate dielectric layer 210 are subjected to another etch processing step 250, which uses at least one precursor, thereby forming the polysilicon material pattern 220a and the gate dielectric layer 210a. The precursor provided in step 250 may comprise, for example, at least one of $Cl_2$, HBr and $CF_4$ and at least one of He, $O_2$ and $N_2$. In some embodiments, step 250 is generally referred to as a "second main etch (ME2)" step. In step 250, $Cl_2$, HBr and/or $CF_4$ are ionized into $Cl-$, $Br-$ and $F-$, respectively, and interact with the polysilicon material pattern 220a and/or the gate dielectric layer 210.

A distinguishing aspect between steps 240 and 250 is that a ratio of He, $O_2$ and/or $N_2$ to the $Cl_2$, HBr and/or $CF_4$ in step 250 is larger than that in step 240. The gas ratio in step 250 is provided such that polysilicon and/or gate dielectric material, e.g., oxide, are not as rapidly removed by step 250 as by step 240. In other words, step 250 has a slower etch rate to the polysilicon layer 220 and/or the gate dielectric layer 210 than step 240. Accordingly, step 250 may not etch through and/or damage the top surface (not labeled) of the substrate 200.

In some embodiments, step 250 is provided to remove remaining polysilicon layer set forth above in connection with step 240. In other embodiments, step 250 removes the gate dielectric layer 210 which is not covered by the mask layer 225, thereby exposing the top surface (not labeled) of the substrate 200.

Like step 240, step 250 uses $Cl-$, $Br-$ and or $F-$ for partially removing the polysilicon material to form polysilicon material pattern 220a and/or the gate dielectric layer 210, charges 245a which may be the charges 245 created in step 240 and/or additional charges generated in step 250, may build up as a by-product of the etching process and become attached to the bottom region of the polysilicon material pattern 220a and/or the gate dielectric layer 210a adjacent thereto. In other words, the charges 245 created in step 240 may be accumulated with, or compensated by, the additional charges created in step 250. According to the example in which, the charges 245 are positive charges, if step 250 also results in positive charges attached to the structure, positive charges 245a represent the accumulated positive charges. In some embodiments, if step 250 produces negative charges, charges 245a represent less positive charges than charges 245, or negative charges accumulated on the structure. If the charges 245a are positive charges and the ions provided in a subsequent etch step are negative (e.g., $Cl-$, $Br-$ and/or $F-$), the negative ions will be attracted to the regions where the charges are accumulated, thereby resulting in undercuts of the gate structure. In other embodiments, if the charges 245a are negative charges and the ions provided in a subsequent etch step are negative, the negative ions will be repelled from the regions where the negative charges are accumulated, thereby resulting in footings of the gate structure.

In some embodiments, only one of the steps 240 and 250 is provided for patterning the polysilicon material pattern 220a if a desired polysilicon profile can be achieved. In still other embodiments, at least one additional etch step (not shown) is provided to achieve a desired polysilicon profile.

Figure 2E:
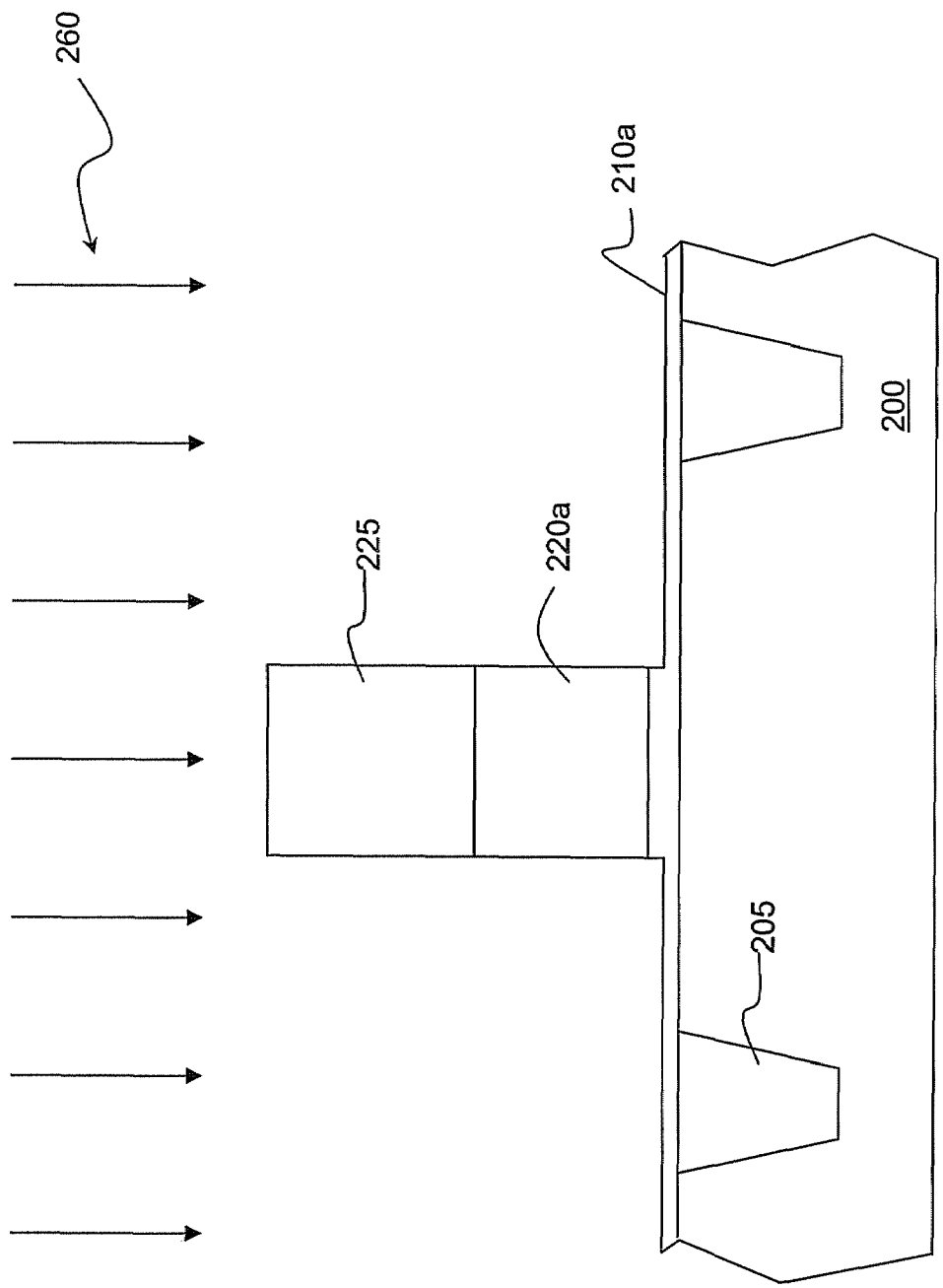

Referring to FIG. 2E, the charges 245a (shown in FIG. 2D) are substantially removed by step 260. Step 260 substantially removes the charges 245a attached to the polysilicon material pattern 220a with at least one discharge gas which reaches the structure as indicated by the arrows. In some embodiments, the discharge gas may comprise helium (He), oxygen gas ($O_2$), argon (Ar), nitrogen ($N_2$) or the like, or combinations thereof. In some preferred embodiments, step 260 utilizes Ar as a discharge gas for removing the charges 245a attached to the polysilicon layer 220a and/ or the gate dielectric layer 210a. Step 260 may include a processing pressure between about 10 milliTorr (mT) and about 100 mT, a source power between about 100 Watts and about 500 Watts, a gas flow rate between about 50 standard cubic centimeters per minute (sccm) and about 200 sccm, and a processing time between about 1 second and about 50 seconds, but other processing conditions capable of removing charges may be used in other exemplary embodiments.

In some embodiments, the discharge gas does not include a gas that substantially interacts with the material layer 215, e.g., the polysilicon layer 220a and/or the gate dielectric layer 210a. In other embodiments, the discharge gas includes a gas whose concentration level is low enough that the latter does not substantially interact with the material layer 215. Accordingly, step 260 does not substantially remove or etch the polysilicon layer 220a and/or the gate dielectric layer 210a.

Figure 2F:
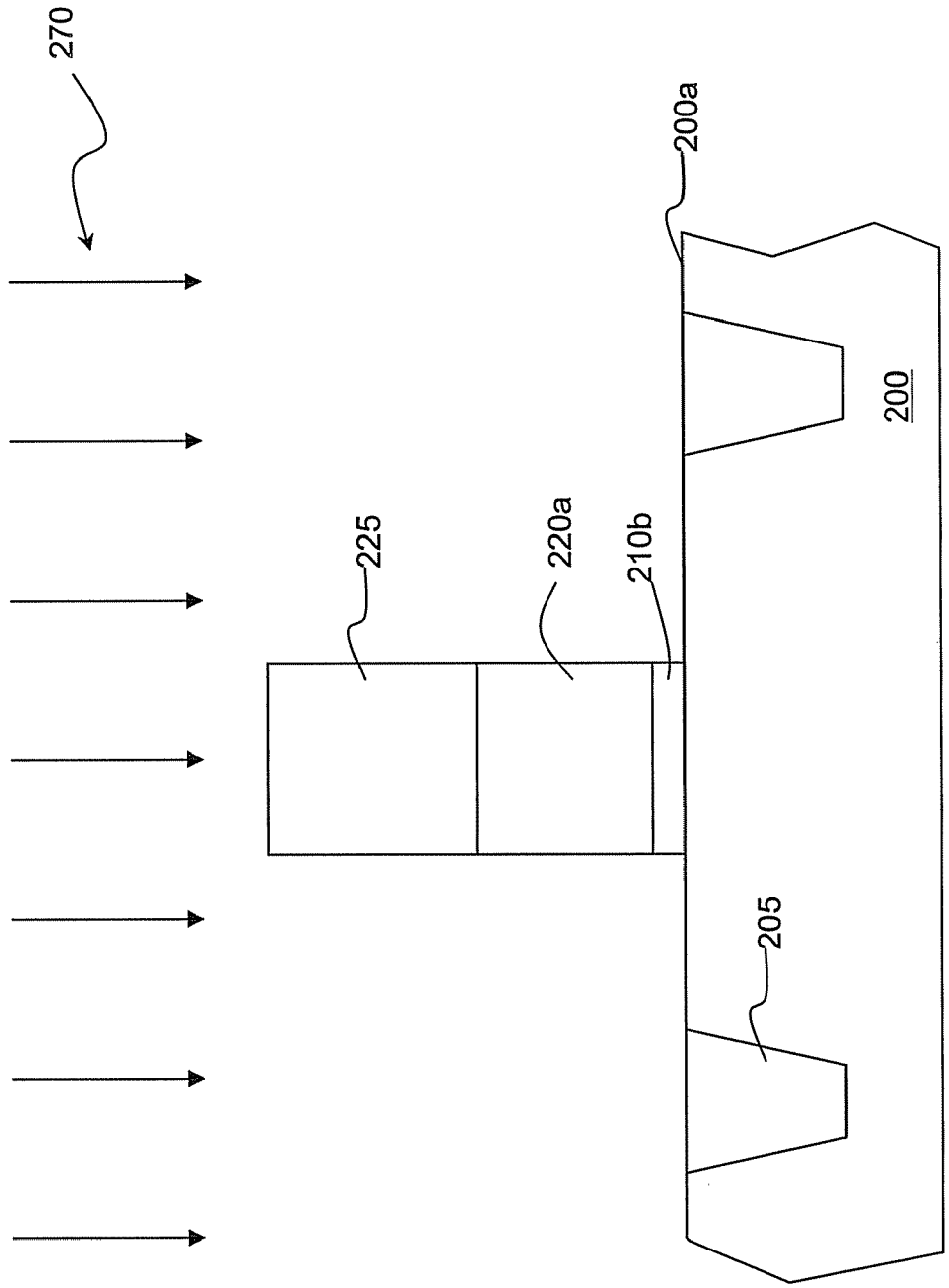

Referring to FIG. 2F, step 270 is provided to remove the portions of gate dielectric layer 210a that are not covered by the mask layer 225, thereby forming the gate dielectric layer 210b and exposing the top surface 200a of the substrate 200. Step 270 uses at least one precursor such as at least one of chlorine gas $Cl_2$, HBr and $CF_4$ and at least one of He, $O_2$ and $N_2$ reaching the structure as indicated by the arrows. In some embodiments, step 270 is generally referred to as an "over-etch (OE)" step. In step 270, $Cl_2$, HBr and/or $CF_4$ are ionized into Cl–, Br– and F–, respectively, and interact with the gate dielectric layer 210a.

A distinguishing aspect between steps 250 and 270 is that a ratio of He, $O_2$ and/or $N_2$ to the $Cl_2$, HBr and/or $CF_4$ in step 270 is larger than that in step 250. The gas ratio in step 270 is provided such that the gate dielectric material, e.g., oxide, is not as rapidly removed by step 270 as by step 250. In other words, step 270 has a slower etch rate to the gate dielectric layer 210a than step 250. Accordingly, step 270 may not substantially damage the top surface 200a of the substrate 200.

In some embodiments, step 270 is also provided to remove remaining polysilicon material (not shown) that is not covered by the mask layer 225 at areas where a thick polysilicon layer 220 was formed or steps 240 and/or 250 had a low etch rate. Accordingly, step 270 may remove remaining polysilicon material that may result in shorting between gate structures if not removed.

As described above in connection with FIG. 2D, the charges 245a are accumulated at the gate structure including the polysilicon material pattern 220a and/or the gate dielectric layer 210a. Step 260 shown in FIG. 2E substantially removes the charges 245a. By removing charges from the polysilicon material pattern 220a and/or the gate dielectric layer 210b, plasmas or ions provided in a subsequent etch step, e.g., the over-etch step 270, will not be attracted to, or repelled from, the regions where the polysilicon material pattern 220a and/or the gate dielectric layer 210b are desired to be removed. Therefore, step 270 will not adversely attack the polysilicon material pattern 220a and/or the gate dielectric layer 210b. Accordingly, step 260 may desirably prevent undercuts or footings of the polysilicon material pattern 220a, e.g., its bottom region that might otherwise be caused by a subsequent etch step, e.g., step 270.

Referring to FIG. 2G, the mask layer 225 is removed, thereby forming a gate structure including the polysilicon material pattern 220a and the gate dielectric layer 210b. The method of removal of the mask layer 225 is determined by the material of which mask layer 225 is formed. For example, if the material of the mask layer 225 is photoresist, any suitable photoresist removal processing step can be provided to remove the photoresist mask layer 225.

In some embodiments, after the formation of the gate structure, source/drain regions (not shown) are formed within the substrate 200 adjacent to the polysilicon material pattern 220a. Further, a silicide layer, e.g., tungsten silicide, cobalt silicide, nickel silicide, or the like, or combinations thereof, may be formed over the polysilicon material pattern 220a for reducing the resistance of the gate structure. Accordingly, a transistor structure is formed.

The scope of the present invention is not limited to the embodiments set forth above in connection with FIGS. 2A-2G. The discharge step 260 may be used in conjunction with processes for forming conductive lines, vias, contacts, trenches, or other semiconductor structures.

Figure 3:
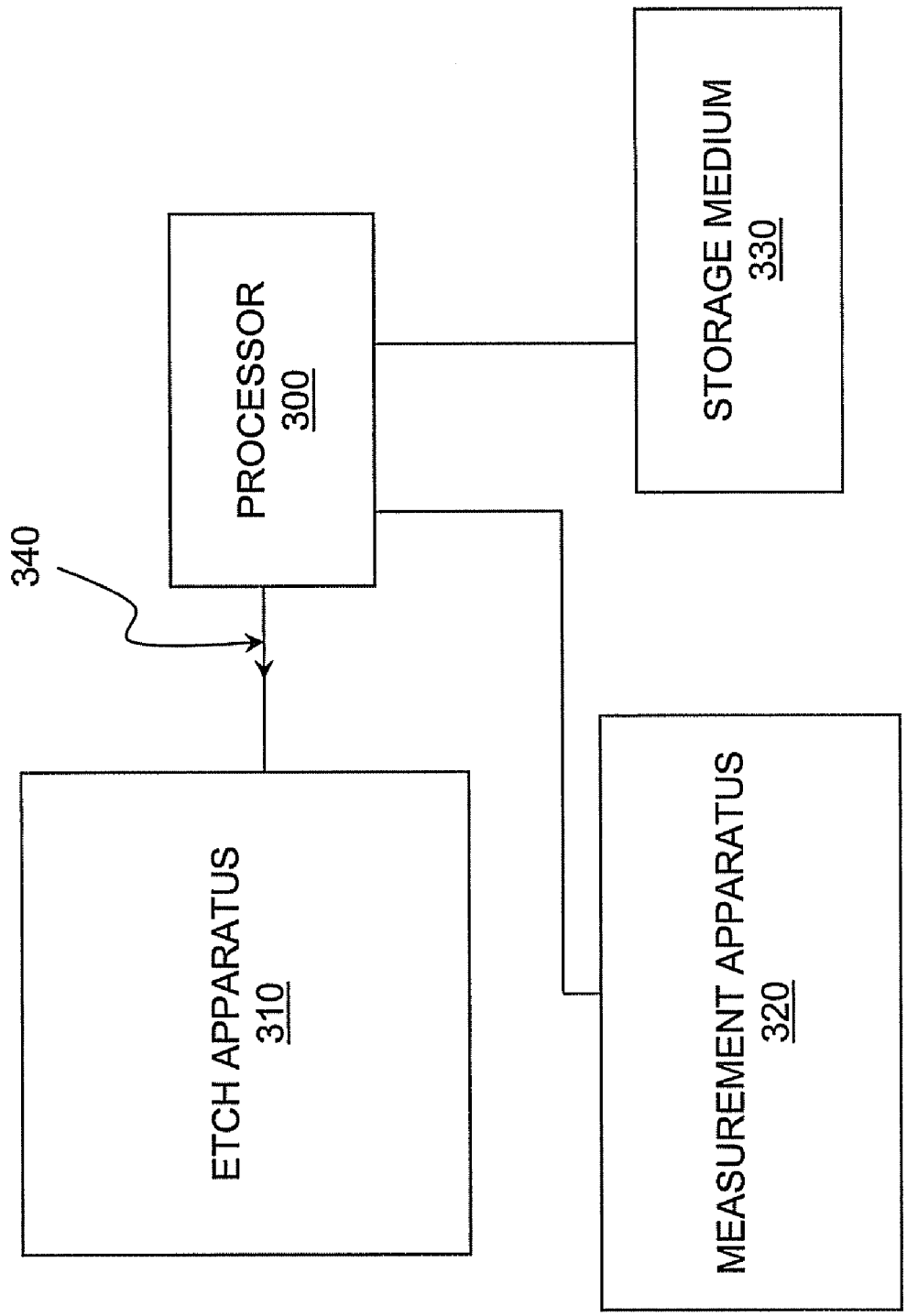
FIG. 3 is a schematic block diagram of a system for forming a semiconductor structure.

FIG. 3 is a schematic block diagram of a system for forming a semiconductor structure. The illustrated system may include a processor 300, an etch apparatus 310 and a measurement apparatus 320. The processor 300 is coupled to the etch apparatus 310 and the measurement apparatus 320. The processor 300 may comprise, for example, at least one of a digital signal processor (DSP), microprocessor, computer, or the like, or combinations thereof.

The etch apparatus 310 is configured to partially etch a material layer formed over a first substrate with at least one first precursor as described above, thereby defining at least one material pattern, and to remove charges of the material pattern with at least one discharging gas. In some embodiments, the etch apparatus 310 may comprise, for example, a poly etcher, a dielectric etcher, a metal etcher, or a system for etching other semiconductor materials, or various combinations thereof. In some embodiments, the etch apparatus 310 is configured to perform at least one of steps 240-270.

The measurement apparatus 320 is configured to monitor a vertical profile of the material pattern, e.g., the polysilicon material pattern 220a illustrated in FIGS. 2C-2F. For example, the measurement apparatus 320 may comprise, for example, a critical dimension-atomic force metrology (CD-AFM), spectroscopic CD (SCD), optical CD (OCD), scanning electron microscope (SEM), a critical dimension SEM (CD-SEM), a cross section SEM (X-SEM), or the like, or combinations thereof.

After the measurement of the vertical profile of the material pattern, the processor 300 compares the vertical profile of the material pattern with a pre-defined profile, thereby yielding at least one comparison result. The processor 300 then applies at least one processing parameter 340, e.g., gas, gas flow rate, processing pressure, source power and processing time, which may be determined based on the comparison result, to the etch apparatus 310 for processing a subsequent substrate.

For example, after comparing the measured vertical profile of the material pattern and the pre-defined pattern, it may be found out that an undercut at the bottom of the material pattern exists. The processor 300 may increase the processing time of step 260 described above in connection with FIG. 2D, thereby enhancing the removal of the charges 245a. On the contrary, if footings are found at the bottom of the material pattern, the processor 300 may reduce the processing time of step 260, thereby achieving a desired pattern profile. In other exemplary embodiments, the processor 300 may adjust at least another of the aforementioned processing parameters based on the comparison results.

In some embodiments, the system further includes a storage medium 330. The storage medium 330 may comprise, for example, at least one of a random access memory (RAM), floppy diskettes, read only memories (ROMs), flash drive, CD-ROMs, DVD-ROMs, hard drives, high density (e.g., "ZIP™") removable disks or any other computer-readable storage medium. The storage medium 330 may be configured to store, for example, at least one of the measured vertical profile of the material pattern, the pre-defined profile, the comparison result, a table comprising the processing parameter 340 corresponding to the comparison result, or the like.

In still other embodiments, the present invention may be embodied in the form of computer-implemented processes and apparatus for practicing those processes. The present invention may also be embodied in the form of computer program code embodied in tangible media, such as floppy diskettes, read only memories (ROMs), CD-ROMs, hard drives, "ZIP™" high density disk drives, flash memory drives, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A method for forming a semiconductor structure, comprising:
    forming a gate dielectric layer over a substrate;
    forming a polysilicon layer over the gate dielectric layer;
    etching at least one first portion of the polysilicon layer with at least one first precursor, thereby defining at least one gate pattern;
    etching at least one second portion of the gate dielectric layer with at least one second precursor, the second precursor mixed with a first carrier gas in a first ratio of carrier gas to precursor;
    removing charges of the gate pattern with at least one discharge gas; and
    etching at least one third portion of the gate dielectric layer with at least one third precursor, the third precursor mixed with a second carrier gas in a second ratio of carrier gas to precursor, the second ratio greater than the first ratio.

2. The method of claim 1, wherein at least one of the first precursor and the second precursor comprises at least one of chlorine gas (Cl$_2$), hydrogen bromide (HBr) and carbon fluoride (CF$_4$) and at least one of helium (He), oxygen gas (O$_2$) and nitrogen gas (N$_2$).

3. The method of claim 1, wherein the discharge gas comprises at least one of helium (He), oxygen gas (O$_2$), argon (Ar) and nitrogen (N$_2$).

4. The method of claim 3, wherein the charge-removing step comprises a pressure between about 10 milliTorr (mT) and about 100 mT, a source power between about 100 Watts and about 500 Watts, a gas flow rate between about 50 standard cubic centimeters per minute (sccm) and about 200 sccm, and a processing time between about 1 second and about 50 seconds.

5. The method of claim 1, wherein the third precursor comprises at least one of chlorine gas (Cl2), hydrogen bromide (HBr) and carbon fluoride (CF$_4$) and at least one of helium (He), oxygen gas (O$_2$) and nitrogen gas (N$_2$).

6. The method of claim 1, wherein the first carrier gas comprises at least one of helium (He), oxygen gas (O$_2$), and nitrogen (N$_2$).

7. The method of claim 6, wherein the second carrier gas comprises at least one of helium (He), oxygen gas (O$_2$), and nitrogen (N$_2$).

8. The method of claim 7, wherein the third carrier gas comprises at least one of helium (He), oxygen gas (O$_2$), and nitrogen (N$_2$).

9. The method of claim 1, wherein
    the first precursor is mixed with a third carrier gas in a third ratio of carrier gas to precursor, and the first ratio is greater than the third ratio.

10. The method of claim 1, wherein the discharge gas comprises oxygen.

11. A method for forming a semiconductor structure, comprising:
    forming a gate dielectric layer over a substrate;
    forming a polysilicon layer over the gate dielectric layer;
    etching at least one first portion of the polysilicon layer with at least one first precursor, thereby defining at least one gate pattern, the first precursor mixed with a first carrier gas in a first ratio of carrier gas to precursor;
    etching at least one second portion of the gate dielectric layer with at least one second precursor, the second precursor mixed with a second carrier gas in a second ratio of carrier gas to precursor, the second ratio greater than the first ratio;
    removing charges of the gate pattern with at least one discharge gas, and
    etching at least one third portion of the gate dielectric layer with at least one third precursor after removing the charges, the third precursor mixed with a third carrier gas in a third ratio of carrier gas to precursor, the second ratio greater than the second ratio wherein:
    the first, second, and third precursors each comprise at least one of chlorine gas (Cl$_2$), hydrogen bromide (HBr) and carbon fluoride (CF$_4$) and at least one of helium (He), oxygen gas (O$_2$) and nitrogen gas (N$_2$),
    the discharge gas comprises at least one of helium (He), oxygen gas (O$_2$), argon (Ar) and nitrogen (N$_2$), and
    the first, second and third carrier gases each comprise at least one of helium (He), oxygen gas (O$_2$), and nitrogen (N$_2$).

12. The method of claim 11, wherein the discharge gas comprises oxygen.

13. A method for forming a semiconductor structure, comprising:

forming a gate dielectric layer over a substrate;

forming a polysilicon layer over the gate dielectric layer;

etching at least one first portion of the polysilicon layer with at least one first precursor, thereby defining at least one gate pattern;

etching at least one second portion of the gate dielectric layer with at least one second precursor; and removing charges of the gate pattern with at least one discharge gas comprising oxygen.

14. The method of claim 13, wherein the second precursor is mixed with a first carrier gas in a first ratio of carrier gas to precursor; and the method further comprises etching at least one third portion of the gate dielectric layer with at least one third precursor, the third precursor mixed with a second carrier gas in a second ratio of carrier gas to precursor, the second ratio greater than the first ratio.

* * * * *